(12) United States Patent
Yao et al.

(10) Patent No.: US 9,935,598 B2
(45) Date of Patent: Apr. 3, 2018

(54) DIFFERENTIAL AMPLIFIER DESIGN AS THE PREAMP OF DMM

(71) Applicant: Fluke Precision Measurement Ltd., Norwich, Norfolk (GB)

(72) Inventors: Hong Yao, Shanghai (CN); Yong Yang, Shanghai (CN); Hua Qui, Shanghai (CN)

(73) Assignee: Fluke Precision Measurement Ltd., Norwich (GB)

( * ) Notice: Subject to any disclaimer, the term of this patent is extended or adjusted under 35 U.S.C. 154(b) by 497 days.

(21) Appl. No.: 14/539,599

(22) Filed: Nov. 12, 2014

(65) Prior Publication Data

US 2015/0130483 A1 May 14, 2015

(30) Foreign Application Priority Data

Nov. 13, 2013 (CN) .......................... 2013 1 0572915

(51) Int. Cl.
- *H03F 3/45* (2006.01)
- *G01R 19/00* (2006.01)
- *G01R 15/12* (2006.01)

(52) U.S. Cl.
CPC ....... *H03F 3/45475* (2013.01); *G01R 15/125* (2013.01); *H03F 2200/261* (2013.01);
(Continued)

(58) Field of Classification Search
CPC ........... G01R 27/26; G01R 27/00; G01L 1/10; G01L 1/20; G01L 1/22; G01N 17/00; G01N 27/02; G01N 27/04; H03F 3/45; H03F 2203/30063; H03F 2203/45244; H03F 3/45179; H03F 3/45071; H03F 3/45183; H03F 1/3211; H03F 3/45076;
(Continued)

(56) References Cited

U.S. PATENT DOCUMENTS 7,023,277 B1 * 4/2006 Perner .................... G11C 7/062
                                                   330/257
7,279,968 B2 * 10/2007 Brokaw ................ H03F 3/3022
                                                   330/144

(Continued)

*Primary Examiner* — Tung X Nguyen
*Assistant Examiner* — Robert P Alejnikov, Jr.
(74) *Attorney, Agent, or Firm* — Seed IP Law Group LLP

(57) ABSTRACT

An amplifying circuit comprises a differential input stage having a first input terminal, a second input terminal, and an intermediate node, wherein the differential input stage is configured to generate a differential current flowing through the intermediate node in response to an input voltage difference between the first and second input terminals. The amplifying circuit further comprises a first current source coupled to the intermediate node, which is configured to provide a first bias current which allows the differential current to vary within a predetermined range. The amplifying circuit further comprises an output terminal coupled to the intermediate node, and a second current source coupled to the intermediate node and configured to provide a second bias current. The second bias current compensates the differential current and the first bias current and produces an output current flowing through the output terminal in a predetermined direction. A measurement device is also described.

23 Claims, 2 Drawing Sheets

(52) U.S. Cl.
CPC ............... *H03F 2200/393* (2013.01); *H03F 2203/45151* (2013.01); *H03F 2203/45528* (2013.01)

(58) Field of Classification Search
CPC ....... H03F 3/45085; H03F 2203/45138; H03F 3/4508; H03K 5/1532; H03K 5/24; H03K 5/2409; H03K 5/2436; H03K 5/2472; H03K 5/2418; H03K 5/2445; H03K 5/2481; G11C 7/06; G11C 7/062; G11C 7/065; G11C 7/067
USPC ............... 324/705, 691, 649; 330/261, 252; 327/50–52
See application file for complete search history.

(56) References Cited

U.S. PATENT DOCUMENTS

| | | | | |
|---|---|---|---|---|
| 7,408,412 B2* | 8/2008 | Yamamoto | ............. | H03F 1/302 330/285 |
| 2006/0125567 A1* | 6/2006 | Mizoe | ................. | H03F 3/3022 330/292 |
| 2007/0001764 A1* | 1/2007 | Huang | ............... | H03F 3/45183 330/261 |
| 2007/0257830 A1* | 11/2007 | Savage | ............... | H03F 1/0277 341/168 |
| 2011/0068863 A1* | 3/2011 | Hebert | ............... | H03G 1/0088 330/75 |
| 2012/0326791 A1* | 12/2012 | Lee | .......................... | H03F 1/26 330/284 |

* cited by examiner

DIFFERENTIAL AMPLIFIER DESIGN AS THE PREAMP OF DMM

FIELD

The present application relates to electrical measurement technology, and more particularly, to an amplifying circuit and a measurement device using the amplifying circuit.

BACKGROUND

Various measurement devices for measuring electrical parameters (such as voltage, current and resistance) are widely used in industrial production and daily life. A multi-meter is a typical electrical measurement device that mainly measures an AC or DC voltage, current and resistance. A typical configuration of the multi-meter generally includes a pair of test lines, wherein one end of each test line is connected to an apparatus or a device under test, and the other end is inserted into a jack on a panel of the multi-meter. The device under test and a measurement circuit inside the multi-meter are therefore electrically connected with each other.

The typical multi-meter usually uses a single-ended amplifier as the pre-amplifier in its internal measurement circuit. In order to measure a test voltage, the multi-meter needs to perform two tests which are the high-side test and low-side test, to obtain two readings, and to calculate and present the value of the test voltage based on the corresponding readings. The high-side and low-side tests can reduce offset voltage disturbances of the amplifier on the measurement results. Furthermore, when a high-precision multi-meter is used to measure the resistance of the device under test, the multi-meter needs to perform four tests to accurately measure the resistance of the device under test. The device under test needs to be tested under two reverse test currents to generate four readings, which include two readings for the high-side test and the other two readings for the low-side test. The two reverse test currents can reduce a thermal noise or low-frequency noise (such as offset voltage-induced noise) in a signal chain of the measurement circuit. However, this measurement method is complicated.

SUMMARY

An objective of the present application is to provide a high-precision measurement circuit.

According to an aspect of the present application, an amplifying circuit is provided. The amplifying circuit comprises a differential input stage having a first input terminal, a second input terminal, and an intermediate node, wherein the differential input stage is configured to generate a differential current flowing through the intermediate node in response to an input voltage difference between the first and second input terminals; a first current source coupled to the intermediate node, and configured to provide a first bias current that allows the differential current to vary within a predetermined range; an output terminal coupled to the intermediate node; and a second current source coupled to the intermediate node, and configured to provide a second bias current, which compensates the differential current and the first bias current and produces an output current flowing through the output terminal in a predetermined direction.

For some post-stage modules of a measurement circuit such as an analog-to-digital converter or other modules, an amplifying circuit with a unidirectional current output capability to provide a pre-amplified signal is needed. The amplifying circuit of the present application meets such requirement. Further, the amplifying circuit of the present application can use a differential amplifier as a pre-amplifier in the measurement circuit of a high-precision multi-meter, which measures a voltage difference across the tested device under a high-side input or a low-side input with one reading. When the high-precision multi-meter uses two reverse test currents to measure a resistor, the number of measurements can be reduced by using the amplifying circuit of the present application. Moreover, the differential amplifier in the amplifying circuit has a good common-mode rejection ratio, which significantly improves the measurement accuracy.

In certain embodiments, the differential input stage comprises a first amplifier having a first input node, a second input node, and a first output node, wherein the first input node of the first amplifier is coupled to the first input terminal, and the second input node of the first amplifier and the first output node are coupled to the intermediate node via a gain resistor; a second amplifier having a first input node, a second input node and a second output node, wherein the first input node of the second amplifier is coupled to the second input terminal, and the second input node of the second amplifier is coupled to the intermediate node; and a first variable resistor coupled between the intermediate node and the output terminal, and having a control node coupled to the second output node.

The differential input stage does not require multiple high-precision resistors to form a differential amplifying circuit, which reduces the cost of the high-precision resistors, and also avoids the potential mismatch of the resistors.

In certain embodiments, the first variable resistor is an FET transistor.

In certain embodiments, the first variable resistor is a P-type MOSFET transistor.

In certain embodiments, two or more gain resistors are selectively coupled between the first output node of the first amplifier and the intermediate node to change a gain of the differential input stage.

In certain embodiments, the second current source comprises a current mirror having a current input node, a common node, and a current output node, wherein the current output node is coupled to the intermediate node, and the current mirror is configured to generate the second bias current in response to a reference current received at the current input node, and provide the second bias current to the current output node; a third amplifier having a first input node, a second input node and a third output node, wherein the first input node of the third amplifier is coupled to the current input node, and the second input node of the third amplifier is coupled to the current output node; and a second variable resistor coupled between the current output node and the output terminal, and having a second control node coupled to the third output node.

In certain embodiments, the second variable resistor is an FET transistor.

In certain embodiments, the second variable resistor is an N-type FET transistor, e.g., N-type JFET transistor or MOSFET transistor.

In certain embodiments, the current mirror further comprises a first resistor coupled between the current input node and the common node, and a second resistor coupled between the current output node and the common node.

In certain embodiments, the predetermined range within which the differential current varies satisfies the following formula:

$$I_d \leq |g V_{IN,max}|$$

where $I_d$ denotes the differential current, g denotes a gain of the differential input stage, and $V_{IN,max}$ denotes a maximum amplitude of the input voltage difference for the differential input stage.

In certain embodiments, the first bias current satisfies the following formula:

$$|I_{REF1}| \geq |gV_{IN,max}|$$

where $I_{REF1}$ denotes the first bias current, g denotes a gain of the differential input stage, and $V_{IN,max}$ denotes a maximum amplitude of the input voltage difference for the differential input stage.

In certain embodiments, the first bias current and the second bias current satisfy the following formula:

$$|I_{REF2}| \geq |gV_{IN,max}| + |I_{REF1}|$$

where $I_{REF2}$ denotes the second bias current.

According to another aspect of the present application, a measurement device is provided. The measurement device comprises a differential input stage having a first input terminal, a second input terminal, and an intermediate node, wherein the differential input stage is configured to generate a differential current flowing through the intermediate node in response to an input voltage difference between the first and second input terminals; a first current source coupled to the intermediate node, and configured to provide a first bias current which allows the differential current to vary within a predetermined range; an output terminal coupled to the intermediate node; a second current source coupled to the intermediate node, and configured to provide a second bias current, which compensates the differential current and the first bias current and produces an output current flowing through the output terminal in a predetermined direction; and an analog-to-digital converter (ADC) coupled to the output terminal, and configured to convert the output current into a digital signal indicative of the input voltage difference.

In certain embodiments, the measurement device further comprises an output resistor coupled between the output terminal and a reference line and for converting the output current to an output voltage, wherein the ADC is configured to convert the output voltage into a digital signal indicative of the input voltage difference.

In certain embodiments, the measurement device is a resistance measurement device or a multi-meter.

In certain embodiments, the measurement device further comprises a third input terminal coupled to the first input terminal; a fourth input terminal coupled to the second input terminal; and a test current source configured to apply a test current to a device under test coupled between the third and fourth input terminals.

The foregoing has outlined, rather broadly, features of the present application. Additional features of the present application will be described, hereinafter, which form the subject of the claims of the present application. It should be appreciated by those skilled in the art that the conception and specific embodiments disclosed herein may be readily utilized as a basis for modifying or designing other structures or processes for carrying out the objectives of the present application. It should also be realized by those skilled in the art that such equivalent constructions do not depart from the spirit and scope of the present application as set forth in the appended claims.

DESCRIPTION OF THE DRAWINGS

The aforementioned features and other features of the application will be further described in the following paragraphs by referring to the accompanying drawings and the appended claims. It will be understood that these accompanying drawing merely illustrate some embodiments in accordance with the present application and should not be considered as limitation to the scope of the present application. Unless otherwise specified, the accompanying drawings need not be proportional, and similar reference characters generally denote similar elements.

DETAILED DESCRIPTION

The following detailed description refers to the accompanying drawings as a part of the present application. The illustrative embodiments described in the detailed description, the accompanying drawings, and the claims are not limiting, and other embodiments may be adopted, or modifications may be made without deviating from the spirit and subject of the application. It should be understood that the various aspects of the application described and graphically presented herein may be arranged, replaced, combined, divided, and designed in many different configurations, and these different configurations are implicitly included in the application.

In the following paragraphs, some specific terms will be used to clearly describe the illustrative embodiments. However, the intent of using these terms is not to limit the scope of protection of this application; the scope of these terms should extend to any equivalent replacements that achieve substantially the same objective in substantially the same way.

Figure 1:
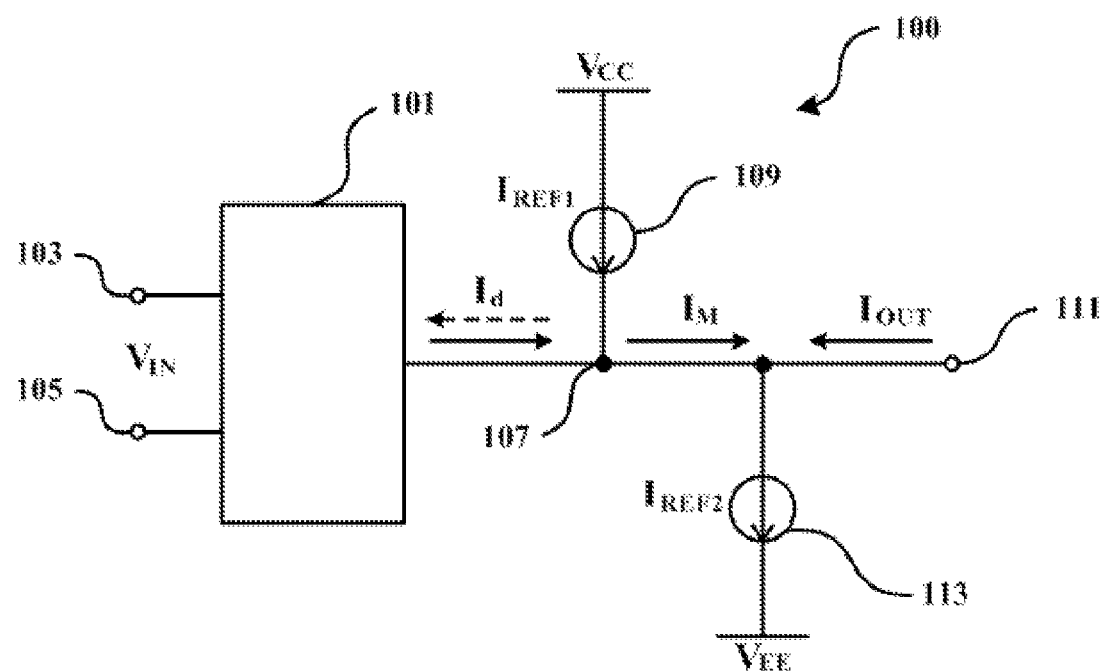
FIG. 1 illustrates an amplifying circuit 100 according to an embodiment of the present application.

FIG. 1 illustrates an amplifying circuit 100 according to an embodiment of the present application. The amplifying circuit 100 may be used as a pre-amplifier of a measurement circuit (e.g., a voltage measurement circuit or resistance measurement circuit). The amplifying circuit 100 can convert a double-ended input signal under test into a single-ended output current signal, and the single-ended output current signal can be further converted into a voltage signal or the like through a post-stage circuit.

As illustrated in FIG. 1, the amplifying circuit 100 includes:

a differential input stage 101 having a first input terminal 103, a second input terminal 105 and an intermediate node 107, wherein the differential input stage 101 is configured to generate a differential current $I_d$ flowing through the intermediate node 107 in response to an input voltage difference $V_{IN}$ between the first input terminal 103 and the second input terminal 105;

a first current source 109 coupled to the intermediate node 107, and configured to provide a first bias current $I_{REF1}$, wherein the first bias current $I_{REF1}$ flows through the intermediate node 107, and allows the differential current $I_d$ to vary within a predetermined range;

an output terminal 111 coupled to the intermediate node 107; and a second current source 113 coupled to the intermediate node 107, and configured to provide a second bias current $I_{REF2}$, which compensates the differential current $I_d$ and the first bias current $I_{REF1}$ and produces an output current $I_{OUT}$ flowing through the output terminal 111 in a predetermined direction.

In certain embodiments, the differential input stage 101 may be a differential op-amp amplifying circuit having two parallel-coupled op-amps, which has a high-input resistance and a high common-mode rejection ratio, and thus can effectively reduce the impact of a common-mode noise on the measurement accuracy.

Note that in the embodiment shown in FIG. 1, the first current source 109 is coupled between a positive supply voltage $V_{CC}$ and the intermediate node 107, thereby the first bias current $I_{REF1}$ flows from the positive supply voltage $V_{CC}$ to the intermediate node 107. Moreover, the second current source 113 is coupled between a negative supply voltage $V_{EE}$ and the intermediate node 107, thereby the second bias current $I_{REF2}$ flows from the intermediate node 107 to the negative supply voltage $V_{EE}$.

The direction of the output current $I_{OUT}$ outputted at the output terminal 111 is associated with the direction of the second bias current $I_{REF2}$. Specifically, the current flowing into the intermediate node 107 should be equal to the current flowing therefrom. Therefore, when a portion of the second bias current $I_{REF2}$ compensates (i.e., offsets) a sum of the differential current $I_d$ and the first bias current $I_{REF1}$, the remaining portion of the second bias current $I_{REF2}$ and the output current $I_{OUT}$ should be mutually offset. Since the second bias current $I_{REF2}$ flows from the intermediate node 107 to the negative supply voltage $V_{EE}$, the output current $I_{OUT}$ flows from the post-stage circuit of the amplifying circuit 100 or a load circuit (not shown) to the intermediate node 107 through the output terminal 111.

It should be understood, in some examples, that the first current source 109 and the second current source 113 may be coupled to a reference potential line (e.g., the positive supply voltage, the negative supply voltage or ground) in a manner different from that shown in FIG. 1. For example, the second current source 113 may be coupled between the positive supply voltage $V_{CC}$ and the intermediate node 107, while the first current source 109 may be coupled between the intermediate node 107 and a reference potential lower than the positive supply voltage (e.g., the negative supply voltage $V_{EE}$ or ground). Accordingly, the first bias current $I_{REF1}$ flows from the intermediate node 107 to the reference potential, and the second bias current $I_{REF2}$ flows from the positive supply voltage $V_{CC}$ to the intermediate node 107. In this case, the output current $I_{OUT}$ should flow from the intermediate node 107 to the post-stage circuit or the load circuit of the amplifying circuit 100 through the output terminal 111.

Hereinafter, the operation of the amplifying circuit 100 in FIG. 1 will be elaborated with reference to an example in which the output current $I_{OUT}$ flows from the post-stage circuit or the load circuit to the amplifying circuit 100 through the output terminal 111. It should be understood by those skilled in the art that the amplifying circuit 100 having a reverse output current $I_{OUT}$ may be likewise implemented.

Specifically, the two input terminals 103 and 105 of the differential input stage 101 are coupled to two ends of a device under test (not shown) in order to measure the input voltage difference $V_{IN}$ across the two ends of the device under test. The measured input voltage difference $V_{IN}$ is converted into the differential current $I_d$ by the differential input stage 101. The differential input stage 101 functions as a voltage-controlled current source with a specific transconductance gain g. Therefore, the differential current $I_d$ satisfies the following equation (1):

$$I_d = gV_{IN} \tag{1}$$

As can be seen from the above equation (1), the differential current $I_d$ varies linearly with the input voltage difference $V_{IN}$. The amplitude of the differential current $I_d$ is proportional to the amplitude of the input voltage difference $V_{IN}$, and the direction of the differential current $I_d$ also depends on the polarity of the input voltage difference $V_{IN}$. For example, if the input voltage difference $V_{IN}$ is greater than zero, then the differential current $I_d$ flows from the differential input stage 101 through the intermediate node 107 to the output terminal 111. If the input voltage difference $V_{IN}$ is less than zero, the direction of the differential current $I_d$ should be opposite to the above, i.e., the differential current $I_d$ flows from the output terminal 111 to the input differential stage 101 through the intermediate node 107.

Note that the differential input stage 101 may be a voltage-controlled current source having a constant gain, where the generated differential current $I_d$ varies linearly with the input voltage difference $V_{IN}$ within the predetermined range. In some embodiments, the differential input stage 101 can also be a current source having a plurality of gain values that can be selected by a user. Accordingly, the differential current $I_d$ generated by the differential input stage 101 may vary linearly with the input voltage difference $V_{IN}$ within various ranges corresponding to the selectable gains. The differential input stage 101 with selectable gains can increase the measurable range of the input voltage difference.

In certain examples, the two input terminals 103 and 105 of the differential input stage 101 can be coupled to a bidirectional voltage clamp circuit, e.g., a Zener diode or a pair of diodes, to prevent the input voltage difference $V_{IN}$ of too big an amplitude to be inputted into the differential input stage 101, thus reducing the risk of failure for the amplifying circuit 100. $V_{IN,max}$ denotes the maximum amplitude of the input voltage difference $V_{IN}$. Accordingly, based on equation (1), a maximum amplitude of the differential current $I_d$ satisfies the following equation (2):

$$I_{d,max} = gV_{IN,max} \tag{2}$$

where, $|I_d| \leq |gV_{IN,max}|$.

In certain embodiments, the first bias current $I_{REF1}$ provided by the first current source 109 flows from the positive supply voltage $V_{CC}$ to the intermediate node 107. In some embodiments, the maximum amplitude of the differential current $I_{d,max}$ should be less than the first bias current $I_{REF1}$, in order to ensure that a summed current of the first bias current $I_{REF1}$ and the differential current $I_{d,max}$ flows in a predetermined direction. In other words, the differential current $I_d$ is allowed to only vary with the input voltage difference within the range of the first bias current $I_{REF1}$. Furthermore, the summed current of the first bias current $I_{REF1}$ and the differential current $I_d$ produces an intermediate current $I_M$ flowing between the intermediate node 107 and the output terminal 111. As the first bias current $I_{REF1}$ is always greater than the differential current $I_d$, the direction of the intermediate current $I_M$ depends on the direction of the first bias current $I_{REF1}$, which flows unidirectionally between the intermediate node 107 and the output terminal 111. In the embodiment shown in FIG. 1, the intermediate current $I_M$ flows from the intermediate node 107 to the output terminal 111.

Furthermore, the amplitude of the intermediate current $I_M$ is associated with the amplitudes of the first the bias current $I_{REF1}$ and the differential current $I_d$. When the differential current $I_d$ flows from the differential input stage 101 to the intermediate node 107, it sums with the first bias $I_{REF1}$ which also flows to the intermediate node 107, whereby forming the intermediate current $I_M$ which flows from the intermediate node 107 to the output terminal 111. In this case, the amplitude of the intermediate current $I_M$ is equal to the sum of the amplitude of the differential current $I_d$ and the amplitude of the first bias current $I_{REF1}$. When the differential current $I_d$ flows from the intermediate node 107 to the differential input stage 101, it is offset by a portion of the first bias current $I_{REF1}$ which flows to the intermediate node 107, thereby forming the intermediate current $I_M$ of an amplitude less than that of the first bias current $I_{REF1}$.

As described above, the intermediate current $I_M$ flows from the intermediate node 107 to the output terminal 111, and the second bias current $I_{REF2}$ flows from the intermediate node 107 to the negative supply voltage $V_{EE}$. Thus, a portion of the second bias current $I_{REF2}$ is offset by the intermediate current $I_M$, and the remaining portion of the second bias current $I_{REF2}$ produces the output current $I_{OUT}$ which flows from the post-stage circuit or the load circuit (not shown) of the amplifying circuit 100 into the amplifying circuit 100 through the output terminal 111. The amplitude of the output current $I_{OUT}$ is equal to an amplitude difference of the second bias current $I_{REF2}$ and the intermediate current $I_M$, and the output current $I_{OUT}$ satisfies the following equation (3):

$$I_{OUT}=I_{REF2}-(I_{REF1}+gV_{IN}) \qquad (3)$$

where, $|I_{REF1}| \geq |gV_{IN,max}|$, and $|I_{REF2}| > |I_{REF1}| + |gV_{IN,max}|$.

Figure 2:
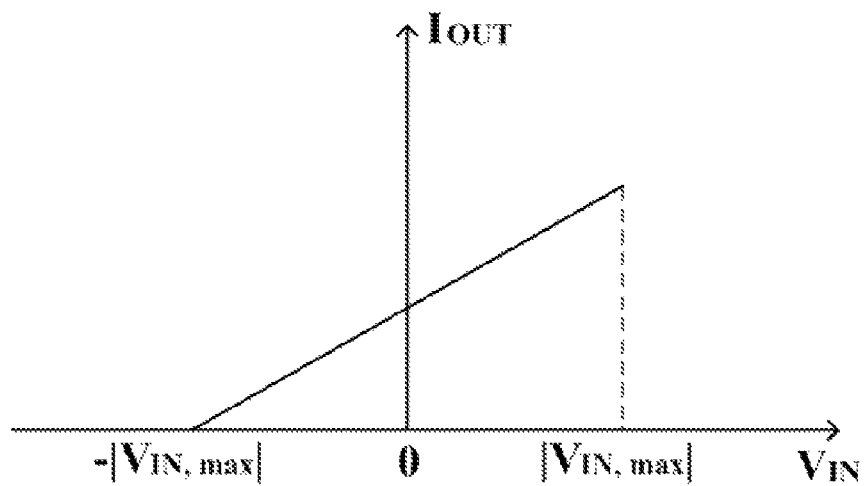
FIG. 2 illustrates an output current as a function of an input voltage difference of the amplifying circuit 100 shown in FIG. 1.

FIG. 2 illustrates an output current as a function of an input voltage difference of the amplifying circuit 100 shown in FIG. 1.

As illustrated in FIG. 2, when the input voltage difference $V_{IN}$ is less than its maximum amplitude $V_{IN,max}$, the output current $I_{OUT}$ varies linearly with the input voltage $V_{IN}$, and the direction of the output current $I_{OUT}$ remains unchanged. That is, a first bias current $I_{REF1}$ and a second bias current $I_{REF2}$ together moves the output current—input voltage difference curve upward (in the direction shown in FIG. 2), and the output current $I_{OUT}$ is greater than zero within a predetermined range, i.e., $\leq |gV_{IN,max}|$. For some post-stage modules such as an analog-to-digital converter, a unidirectional input current can reduce circuit complexity, thereby reducing the manufacturing cost. In addition, a single-ended output current signal is also easier for the post-stage circuit to process. For example, the analog-to-digital converter may sample its input current signal by charging a sampling capacitor with its input current signal. The single-ended output current of the amplifying circuit 100 as shown in FIG. 1 can then be directly provided to the analog-to-digital converter, thereby improving the compatibility of the amplifying circuit.

As can be seen from the foregoing, the amplifying circuit 100 can use the differential input stage as the pre-amplifier in the measurement circuit of a high-precision multi-meter, which measures the voltage difference across the tested device under a high-side input or a low-side input with one reading. When the high-precision multi-meter uses two reverse currents to measure a resistor, the number of measurements can be reduced by using the amplifying circuit of the present application. Furthermore, the differential amplifier in the amplifying circuit has a good common-mode rejection ratio, which can significantly improve the measurement accuracy 100.

Figure 3:
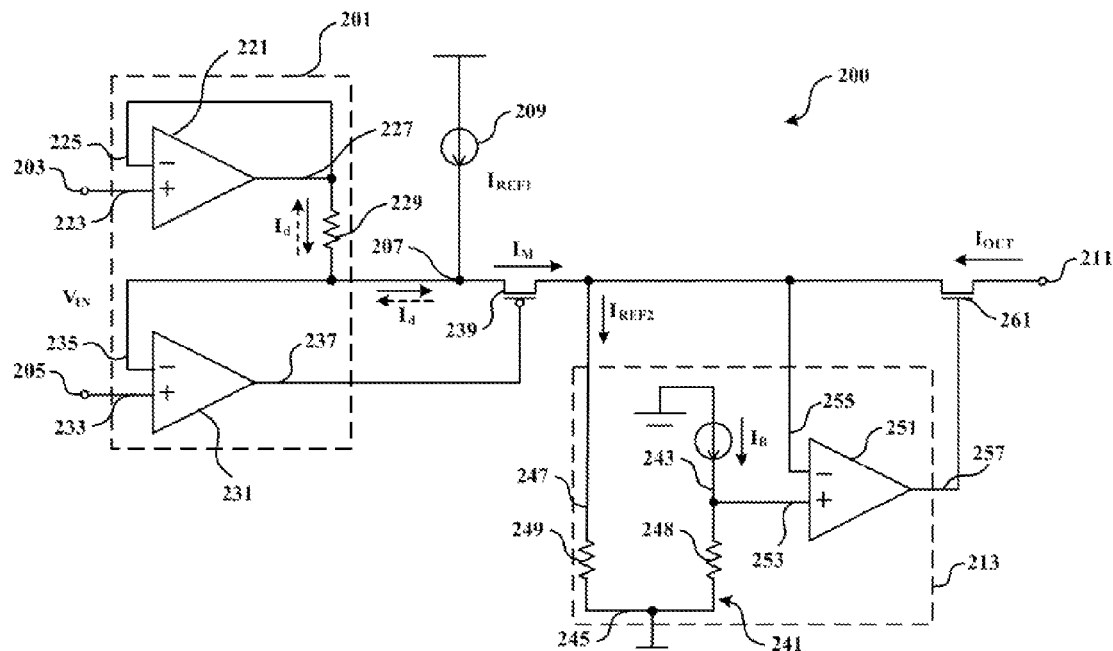
FIG. 3 illustrates an amplifying circuit 200 according to another embodiment of the present application.

FIG. 3 illustrates an amplifying circuit 200 according to an embodiment of the present application.

As shown in FIG. 3, the amplifying circuit 200 includes:
a differential input stage 201 having a first input terminal 203, a second input terminal 205, and an intermediate node 207; wherein the differential input stage 201 is configured to generate a differential current $I_d$ flowing through the intermediate node 207 in response to an input voltage difference $V_{IN}$ between the first input terminal 203 and second input terminal 205;

a first current source 209 coupled to the intermediate node 207, and configured to provide a first bias current $I_{REF1}$, wherein the first bias current $I_{REF1}$ flows through the intermediate node 207 and allows the differential current $I_d$ to vary within a predetermined range;

an output terminal 211 coupled to the intermediate node 207; and a second current source 213 coupled to the output terminal 211, and configured to provide a second bias current $I_{REF2}$, which compensates the differential current $I_d$ and the first bias current $I_{REF1}$ and produces an output current $I_{OUT}$ flowing through the output terminal 211 in a predetermined direction.

In the embodiment illustrated by FIG. 3, the differential input stage 201 includes a first amplifier 221, a second amplifier 231, and a first variable resistor 239. The first amplifier 221 includes a first input node 223, a second input node 225, and a first output node 227, wherein the first input node 223 of the first amplifier 221 is coupled to the first input terminal 203, and the second input node 225 and the first output node 227 of the first amplifier 221 are coupled to the intermediate node 207 via a gain resistor 229.

The second amplifier 231 includes a first input node 233, a second input node 235, and a second output node 237, wherein the first input node 233 of the second amplifier 231 is coupled to the second input terminal 205, and the second input node 235 of the second amplifier 231 is coupled to the intermediate node 207. In some embodiments, the first amplifier 221 and the second amplifier 231 are operational amplifiers, wherein the first input nodes 223 and 233 are both non-inverting input nodes, and the second input nodes 225 and 235 are both inverting input nodes. These two operational amplifiers 221 and 231 are configured as voltage followers with high-input resistance, thereby the differential input stage 201 can accurately sample the input voltage difference $V_{IN}$ between the first input terminal 203 and the second input terminal 205.

Specifically, according to the "virtual short" feature of operational amplifiers, input voltages at two input nodes of an ideal operational amplifier (offset voltage between the input nodes is zero) with a negative feedback path are equal. Therefore, the voltage at the first input node 223 of the first amplifier 221 is equal to the voltage at the second input node 225, and thus, the voltage at the first input terminal 203 is transferred to the first output node 227. Furthermore, the voltage at the first input node 233 of the second amplifier 231 is equal to the voltage at the second input node 235. Thus, the voltage at the second input terminal 205 is transferred to the second input node 235 of the second amplifier 231, which is the intermediate node 207.

Thus, the input voltage difference $V_{IN}$ is transferred between the intermediate node 207 (i.e., the second input node 235 of the second amplifier 231) and the second input node 225 of the first amplifier 221 by the first amplifier 221 and the second amplifier 231. Correspondingly, a gain g of the differential input stage 201 is inversely proportional to the resistance of the gain resistor 229 coupled between these two nodes. In some embodiments, the gain resistor 229 may be a resistor having a constant resistance. Thus, the gain g of the differential input stage 201 is inversely proportional to the resistance of the gain resistor 229. In some embodiments, the gain resistor 229 may include two or more resistors, one or more of which may be selectively coupled between the intermediate node 207 and the first output node 227 by a user. Accordingly, the gain g of the differential input stage 201 is inversely proportional to the resistance of a resistive network consisting of the selected resistor(s). In view of the foregoing, the gain g of the differential input stage 201 can be adjusted by changing the resistance of the gain resistor 229, thereby adjusting the range of the differential current $I_d$ and a slope of curve of the output current to the input voltage difference shown in FIG. 2.

The first variable resistor 239 is coupled between the intermediate node 207 and the output terminal 211, and having a control node coupled to the second output node 237. In some embodiments, the first variable resistor 239 is unidirectionally conductive. The resistance of the first variable resistor 239 is related to the voltage at its control node. In the embodiment shown in FIG. 3, the operation of the first variable resistor 239 depends on the voltage outputted at the second output node 237 of the second amplifier 231. In some embodiments, the first variable resistor 239 is a voltage-controlled resistive component such as an FET transistor. In some embodiments, the first variable resistor 239 is a P-type MOSFET transistor. The P-type MOSFET transistor has a small drain current and good control characteristics. A source of the PMOS transistor is coupled to the intermediate node 207, with its drain coupled to the output terminal 211 and its gate (control terminal) coupled to the second output node 237. In normal operation, a first variable resistor 239 needs to work in a variable resistance region. To meet such requirement, the amplitude of the first bias current $I_{REF1}$ needs to be greater than a maximum amplitude of the differential current $I_d$, in order to ensure that the current always flows through the first variable resistor 239 in a predetermined direction (a direction from left to right in FIG. 3). The first variable resistor 239 functions as a voltage coupling device between the intermediate node 207 and the output terminal 211.

After the first bias current $I_{REF1}$ is summed with the differential current $I_d$, an intermediate current $I_M$, which flows through the first variable resistor 239, is produced. The intermediate current $I_M$ is further summed with the second bias current $I_{REF2}$. In some embodiments, the second current source 213 includes a current mirror 241, a third amplifier 251 and a second variable resistor 261. Specifically, the current mirror 241 includes a current input node 243, a common node 245, and a current output node 247. The current input node 243 is used for receiving a reference current $I_B$, which flows through a first current path of the current mirror 241 between the current input node 243 and the common node 245. The current mirror 241 further produces the second bias current $I_{REF2}$ based on the reference current $I_B$, and supplies the second bias current $I_{REF2}$ in a second current path of the current mirror 241 between the common node 245 and current output node 247. The second bias current $I_{REF2}$ is then provided through the current output node 247 to the output terminal 211.

The third amplifier 251 includes a first input node 253, a second input node 255, and a third output node 257. In some embodiments, the third amplifier 251 is an operational amplifier, wherein the first input node 253 is a non-inverting input node, and the second input node 225 is an inverting input node. According to the "virtual short" feature of operational amplifiers, the voltage at the first input node 253 is equal to the voltage at the second input node 255, i.e., the voltage at the current input node 243 of the current mirror 241 is equal to the voltage at the current output node 247. In some embodiments, the current mirror 241 includes a first resistor 248 coupled in the first current path and a second resistor 249 coupled in the second current path. Thus, the amplitudes of the second bias current $I_{REF2}$ and the reference current $I_B$ are inversely proportional to a resistance ratio of the first resistor 248 and the second resistor 249. In some embodiments, the resistances of the first resistor 248 and the second resistor 249 are equal. Thus, the amplitude of the second bias current $I_{REF2}$ may be equal to the amplitude of the reference current $I_B$.

The third output node 257 of the third amplifier 251 is coupled to a control node of the second variable resistor 261 in order to control the resistance of the second variable resistor 261. Similar to the first variable resistor 239, the second variable resistor 261 may also be a voltage-controlled resistive component such as an FET transistor operating in the variable resistance region. In some embodiments, the second variable resistor 261 may be an N-FET transistor, e.g., an N-type JFET transistor or an N-type MOSFET transistor. A source of the N-type transistor is coupled to the intermediate node 207 via the first variable resistor 239, with its drain coupled to the output terminal 211 and its gate (control terminal) coupled to the third output node 257. In normal operation, the second variable resistor 239 needs to operate in the variable resistance region. The second variable resistor 239 substantially functions as a voltage coupling device between the intermediate node 207 and the output terminal 211.

In operation of the amplifying circuit 200, the first input terminal 203 and the second input terminal 205 sample the input voltage difference $V_{IN}$ and convert such voltage difference $V_{IN}$ to the differential current $I_d$ via the differential input stage 201. After the first differential current $I_d$ and the first bias current $I_{REF1}$ are summed at the intermediate node 207, the intermediate current $I_M$ flowing through the first variable resistor 239 is produced. After that, the intermediate current $I_M$ is at least partially offset by the second bias current $I_{REF2}$, thereby producing the output current $I_{OUT}$ flowing through the second variable resistor 261 at the output terminal 211. Moreover, the direction of the output current $I_{OUT}$ does not vary when the amplitude and direction of the input voltage difference $V_{IN}$ varies.

For the amplifying circuit 200, it is not required to use high-precision resistors to increase the gain of the circuit, thus its manufacturing cost is significantly reduced. Furthermore, the single-ended output current signal is compatible with various types of post-stage analog-to-digital converting circuits, which further improves the compatibility of the amplifying circuit.

Figure 4:
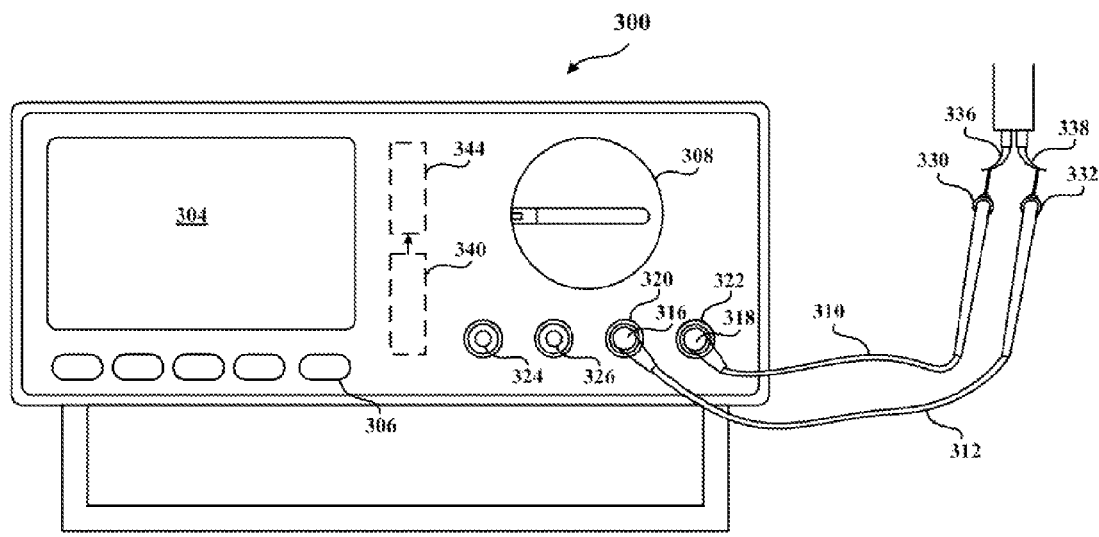
FIG. 4 illustrates a measurement device 300 using an amplifying circuit according to an embodiment of the present application.

FIG. 4 illustrates a measurement device 300 using an amplifying circuit of the present application. For example, the measurement device 300 is a multi-meter or a resistance measurement device. It will be appreciated by those skilled in the art that the amplifying circuit of the present application could be applied in other measurement devices as well.

As shown in FIG. 4, the measurement device 300 includes a digital display 304, manual buttons 306, and a mode selection switch 308. The mode selection switch 308 is switched to a position indicative of current measurement. Although the measurement device 300 uses the digital display 304, it could be understood that other types of display such as an analog display can also be used. Similarly, other operation interfaces may be used besides the buttons 306 and the switch 308. A pair of test lines 310 and 312 have plugs 316 and 318, respectively. Both of the plugs 316 and 318 are inserted into jacks 320 and 322 of the measurement device 300, which are connected to two input terminals of an amplifying circuit 340, respectively. The amplifying circuit 340 may be the amplifying circuit 100 or 200 shown in FIG. 1 or 3, for example. One of the plugs 316 or 318 can be inserted into either jack 324 or 326, thereby the mode of the multi-meter can be selected among current measurement, voltage measurement or other electrical parameter measurements with the mode selection switch 308. The test lines 310 and 312 also have a first test probe 330 and a second test probe 332, respectively, which are connected to test points 336 and 338 on a device under test. Then the device under test is connected with the amplifying circuit 340 via the test lines 310 and 312. The two test probes are used to sample the voltage difference between the test points 336 and 338 on the device under test.

The measurement device 300 further includes an analog-to-digital converter 344, which is coupled to an output terminal of the amplifying circuit 340 and is used to convert an output current into a digital signal representing the sampled voltage difference. In some embodiments, the measurement device 300 further includes an output resistor (not shown), which is coupled between the output terminal of the amplifier circuit 340 and a reference potential line, and is used for converting the output current into an output voltage. Accordingly, the analog-to-digital converter 344 may be used to convert the output voltage into the digital signal representing the sampled voltage difference between the input terminals, i.e., the analog-to-digital converter 344 indirectly converts the output current into the digital signal.

In some embodiments, the measurement device 300 further includes a third input terminal (not shown) coupled to the first input terminal; a fourth input terminal (not shown) coupled to the second input terminal; and a test current source (not shown). The test current source is used to apply a test current to the device under test coupled between the third and fourth input terminals. The test current is generally of constant amplitude known to a user. Thus, the measurement device 300 not only can determine the test current flowing through the device under test, but also sample the voltage difference across two ends of the device under test, such that a resistance of the device under test can be calculated and determined using these two parameters. The measured resistance can be provided to the digital display 304 for displaying a digital reading after being processed by a post-stage circuit of the analog-to-digital converter 344.

It should be noted that, although several modules or sub-modules of the circuit have been described in the previous paragraphs, such division is exemplary and not mandatory. Practically, according to the embodiments of the present application, the functions and features of two or more modules described above may be embodied in one module. On the other hand, the function and feature of any one module described above may be embodied in two or more modules.

While the present application has been illustrated and described in detail in the drawings and foregoing description, such illustration and description are to be considered illustrative or exemplary and not restrictive; the present application is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope. The scope and spirit of the present application is defined by the appended claims.

The embodiments of the invention in which an exclusive property or privilege is claimed are defined as follows:

1. An amplifying circuit, comprising:
    a differential input stage having a first input terminal, a second input terminal, and an intermediate node, wherein the differential input stage is configured to generate a differential current flowing through the intermediate node in response to an input voltage difference between the first and second input terminals;
    an output terminal coupled to the intermediate node;
    a first current source coupled to the intermediate node such that the first current source provides to the intermediate node a first bias current having a maximum amplitude which allows a sum of the first bias current and the differential current to vary within a range bounded by the maximum amplitude of the first bias current and to flow as an intermediate current unidirectionally between the intermediate node and the output terminal; and
    a second current source coupled to the intermediate node such that the second current source provides to the intermediate node a second bias current which at least partially offsets the sum of the differential current and the first bias current and causes an output current to flow through the output terminal in a single direction.

2. The amplifying circuit of claim 1, wherein the differential input stage comprises:
    a first amplifier having a first input node, a second input node, and a first output node, wherein the first input node of the first amplifier is coupled to the first input terminal, and the second input node of the first amplifier and the first output node are coupled to the intermediate node via a gain resistor;
    a second amplifier having a first input node, a second input node, and a second output node, wherein the first input node of the second amplifier is coupled to the second input terminal, and the second input node of the second amplifier are coupled to the intermediate node; and
    a first variable resistor coupled between the intermediate node and the output terminal and having a control node coupled to the second output node.

3. The amplifying circuit of claim 2, wherein the first variable resistor is an FET transistor.

4. The amplifying circuit of claim 3, wherein the first variable resistor is a P-type MOSFET transistor.

5. The amplifying circuit of claim 2, wherein the gain resistor includes two or more resistors that are selectively coupled between the first output node of the first amplifier and the intermediate node to change a gain of the differential input stage.

6. The amplifying circuit of claim 2, wherein the second current source comprises:
    a current mirror having a current input node, a common node, and a current output node, wherein the current output node is coupled to the intermediate node, and the current mirror is configured to generate the second bias current in response to a reference current received at the current input node, and provide the second bias current to the current output node;
    a third amplifier having a first input node, a second input node, and a third output node, wherein the first input node of the third amplifier is coupled to the current input node, and the second input node of the third amplifier is coupled to the current output node; and a second variable resistor coupled between the current output node and the output terminal and having a second control node coupled to the third output node.

7. The amplifying circuit of claim 6, wherein the current mirror further comprises a first resistor coupled between the current input node and the common node, and a second resistor coupled between the current output node and the common node.

8. The amplifying circuit of claim 6, wherein the second variable resistor is an FET transistor.

9. The amplifying circuit of claim 8, wherein the second variable resistor is an N-type FET transistor.

10. The amplifying circuit of claim 1, wherein the predetermined range within which the differential current varies satisfies the following formula:

$$I_d \le |gV_{IN,max}|$$

wherein $I_d$ denotes the differential current, g denotes a gain of the differential input stage, and $V_{IN,max}$ denotes a maximum amplitude of the input voltage difference for the differential input stage.

11. The amplifying circuit of claim 1, wherein the first bias current satisfies the following formula:

$$|I_{REF1}| \ge |gV_{IN,max}|$$

wherein $I_{REF1}$ denotes the first bias current, g denotes a gain of the differential input stage, and $V_{IN,max}$ denotes a maximum amplitude of the input voltage difference for the differential input stage.

12. The amplifying circuit of claim 11, wherein the first bias current and the second bias current satisfy the following formula:

$$|I_{REF2}| \ge |gV_{IN,max}| + |I_{REF1}|$$

wherein $I_{REF2}$ denotes the second bias current.

13. A measurement device, comprising:
a differential input stage having a first input terminal, a second input terminal, and an intermediate node, wherein the differential input stage is configured to generate a differential current flowing through the intermediate node in response to an input voltage difference between the first and second input terminals;
an output terminal coupled to the intermediate node;
a first current source coupled to the intermediate node such that the first current source provides to the intermediate node a first bias current having a maximum amplitude which allows a sum of the first bias current and the differential current to vary within a range bounded by the maximum amplitude of the first bias current and to flow as an intermediate current unidirectionally between the intermediate node and the output terminal;
a second current source coupled to the intermediate node such that the second current source provides to the intermediate node a second bias current which at least partially offsets the sum of the differential current and the first bias current and causes an output current to flow through the output terminal in a single direction; and
an analog-to-digital converter (ADC) coupled to the output terminal and configured to convert the output current into a digital signal indicative of the input voltage difference.

14. The measurement device of claim 13, wherein the differential input stage comprises:
a first amplifier having a first input node, a second input node, and a first output node, wherein the first input node of the first amplifier is coupled to the first input terminal, and the second input node of the first amplifier and the first output node are coupled to the intermediate node via a gain resistor;
a second amplifier having a first input node, a second input node, and a second output node, wherein the first input node of the second amplifier is coupled to the second input terminal, and the second input node of the second amplifier is coupled to the intermediate node; and
a first variable resistor coupled between the intermediate node and the output terminal and having a control node coupled to the second output node.

15. The measurement device of claim 14, wherein a gain resistor that includes two or more resistors is selectively coupled between the first output node of the first amplifier and the intermediate node to change a gain of the differential input stage.

16. The measurement device of claim 14, wherein the second current source comprises:
a current mirror having a current input node, a common node, and a current output node, wherein the current output node is coupled to the intermediate node and the current mirror is configured to generate the second bias current in response to a reference current received at the current input node and provide the second bias current to the current output node;
a third amplifier having a first input node, a second input node, and a third output node, wherein the first input node of the third amplifier is coupled to the current input node and the second input node of the third amplifier is coupled to the current output node; and
a second variable resistor coupled between the current output node and the output terminal, and having a second control node coupled to the third output node.

17. The measurement device of claim 16, wherein the current mirror further comprises a first resistor coupled between the current input node and the common node and a second resistor coupled between the current output node and the common node.

18. The measurement device of claim 13, wherein the predetermined range within which the differential current varies satisfies the following formula:

$$I_d \le |gV_{IN,max}|$$

wherein $I_d$ denotes the differential current, g denotes a gain of the differential input stage, and $V_{IN,max}$ denotes a maximum amplitude of the input voltage difference for the differential input stage.

19. The measurement device of claim 13, wherein the first bias current satisfies the following formula:

$$|I_{REF1}| \ge |gV_{IN,max}|$$

wherein $I_{REF1}$ denotes the first bias current, g denotes a gain of the differential input stage, and $V_{IN,max}$ denotes a maximum amplitude of the input voltage difference for the differential input stage.

20. The measurement device of claim 19, wherein the first bias current and the second bias current satisfy the following formula:

$$|I_{REF2}| \ge |gV_{IN,max}| + |I_{REF1}|$$

wherein $I_{REF2}$ denotes the second bias current.

21. The measurement device of claim 13, wherein the measurement device is a resistance measurement device or a multi-meter.

22. An amplifying circuit, comprising:
a differential input stage having a first input terminal, a second input terminal, and an intermediate node, wherein the differential input stage is configured to generate a differential current flowing through the intermediate node in response to an input voltage difference between the first and second input terminals;
an output terminal coupled to the intermediate node;
a first current source coupled to the intermediate node such that the first current source provides to the intermediate node a first bias current having a maximum amplitude which allows a sum of the first bias current and the differential current to vary within a range bounded by the maximum amplitude of the first bias current and to flow as an intermediate current unidirectionally between the intermediate node and the output terminal;
a second current source coupled to the intermediate node such that the second current source provides to the intermediate node a second bias current which at least partially offsets the sum of the differential current and the first bias current and causes an output current to flow through the output terminal in a single direction, wherein the second current source comprises:
   a current mirror having a current input node, a common node, and a current output node, wherein the current output node is coupled to the intermediate node, and the current mirror is configured to generate the second bias current in response to a reference current received at the current input node, and provide the second bias current to the current output node;
   an amplifier having a first input node, a second input node, and an output node, wherein the first input node of the amplifier is coupled to the current input node, and the second input node of the amplifier is coupled to the current output node; and
   a variable resistor coupled between the current output node and the output terminal and having a control node coupled to the output node of the amplifier.

23. The amplifying circuit of claim 22, wherein the current mirror further comprises a first resistor coupled between the current input node and the common node, and a second resistor coupled between the current output node and the common node.

* * * * *